United States Patent
Surberg et al.

(10) Patent No.: US 10,745,801 B2
(45) Date of Patent: Aug. 18, 2020

(54) CUTTING PLATE AND MANUFACTURING METHOD

(71) Applicant: Hilti Aktiengesellschaft, Schaan (LI)

(72) Inventors: Cord-Henrik Surberg, Feldkirch (AT); Orlaw Massler, Triesenberg (LI); Matthias Leischner, Nuremberg (DE); Stefan Rosiwal, Bamberg (DE)

(73) Assignee: Hilti Aktiengesellschaft, Schaan (LI)

( * ) Notice: Subject to any disclaimer, the term of this patent is extended or adjusted under 35 U.S.C. 154(b) by 108 days.

(21) Appl. No.: 15/760,205

(22) PCT Filed: Sep. 13, 2016

(86) PCT No.: PCT/EP2016/071491
§ 371 (c)(1),
(2) Date: Mar. 14, 2018

(87) PCT Pub. No.: WO2017/046047
PCT Pub. Date: Mar. 23, 2017

(65) Prior Publication Data
US 2018/0265966 A1    Sep. 20, 2018

(30) Foreign Application Priority Data
Sep. 15, 2015 (EP) ..................... 15185257

(51) Int. Cl.
*C23C 16/27* (2006.01)
*C23C 16/02* (2006.01)
(Continued)

(52) U.S. Cl.
CPC .............. *C23C 16/27* (2013.01); *B28D 1/041* (2013.01); *C23C 16/0272* (2013.01);
(Continued)

(58) Field of Classification Search
USPC ........ 51/307, 309; 427/249.1, 249.7, 249.13, 427/299, 577; 428/408, 698, 704
See application file for complete search history.

(56) References Cited

U.S. PATENT DOCUMENTS 4,707,384 A * 11/1987 Schachner .......... C23C 16/0272
427/249.14
5,135,807 A * 8/1992 Ito ....................... C23C 14/0605
428/408
(Continued)

FOREIGN PATENT DOCUMENTS

EP    503822   *   9/1992
EP    0614998      9/1994
(Continued)

*Primary Examiner* — Archene A Turner
(74) *Attorney, Agent, or Firm* — Davidson, Davidson & Kappel, LLC (57) ABSTRACT

The cutting plate 12 includes a base body 22 made of a sintered hard metal. On a top side 23 of the base body 22 there are one or multiple intermediate layers 25 that include an adhesion-promoting layer 26. The adhesion-promoting layer 26 is made of a boron-containing nitride of a transition metal of group IV, group V, and group VI, and contains a plurality of small plates 31 oriented at an angle relative to the top side 23. A diamond layer that is grown on the adhesion-promoting layer 26 includes stalk-shaped crystals, oriented vertically relative to the top side 23, having an aspect ratio greater than three.

9 Claims, 4 Drawing Sheets

(51) Int. Cl.
*C23C 16/34* (2006.01)
*C23C 28/04* (2006.01)
*B28D 1/04* (2006.01)

(52) U.S. Cl.
CPC ............ *C23C 16/34* (2013.01); *C23C 16/342* (2013.01); *C23C 28/042* (2013.01)

(56) References Cited

U.S. PATENT DOCUMENTS

| | | | |
|---|---|---|---|
| 9,175,384 B2* | 11/2015 | Bareiss | ............... C23C 16/0281 |
| 2006/0147631 A1* | 7/2006 | Lev | ............... C23C 4/02 |
| | | | 427/290 |
| 2006/0216515 A1* | 9/2006 | Kazahaya | ................ B23G 5/06 |
| | | | 428/408 |
| 2016/0186363 A1 | 6/2016 | Merzaghi et al. | |

FOREIGN PATENT DOCUMENTS

| | | |
|---|---|---|
| EP | 2832899 | 2/2015 |
| WO | WO2008/116238 | 10/2008 |

\* cited by examiner

CUTTING PLATE AND MANUFACTURING METHOD

FIELD OF THE INVENTION

The present invention relates to cutting elements for machining mineral construction materials, in particular steel-reinforced concrete. Moreover, the present invention relates to a manufacturing method for such a cutting element.

SUMMARY OF THE INVENTION

The present invention provides a cutting plate including a base body made of a sintered hard metal. On a top side of the base body there are one or multiple intermediate layers that include an adhesion-promoting layer. The adhesion-promoting layer is made of a boron-containing nitride of a transition metal of group IV, group V, and group VI, and contains a plurality of lenticular small plates oriented at an angle relative to the top side. A diamond layer that is grown on the adhesion-promoting layer includes stalk-shaped crystals, oriented vertically relative to the top side, having an aspect ratio greater than three, preferably greater than five.

The boron-containing small plate structure allows a stable bond of the stalk-shaped crystals of the diamond layer. Despite the great difference in the coefficient of thermal expansion of the hard metal and the high internal cooling stresses that arise with thick diamond layers, the mechanical bracing with the diamond layer having the small plate structure and the good chemical bond results in very good adhesion, which allows even a percussive load without chipping of the diamond layer.

One embodiment provides that the top side of the base body is very rough on a 1-mm scale. An average peak-to-valley height Rz, defined according to DIN ISO 4287 for a measuring section having a length of 800 µm, is at least 5 µm, preferably at most 12 µm.

Embodiments of the present invention provide that the stalk-shaped crystals may be in parallel to one another, a height of the stalk-shaped crystals may be equal to a height of the diamond layer, the stalk-shaped crystals may adjoin one another via grain boundaries, and the stalk-shaped crystals have approximately the same diameter.

A manufacturing method according to the present invention for a cutting plate (12), in particular a cutting plate (12) for a core drill bit (2), provides the following steps. A base body is sintered and shaped from a hard metal. One or multiple intermediate layers (25), including an adhesion-promoting layer (26), are deposited on a top side (23) of base body (22) with the aid of a gas deposition process (CVD). The deposition of adhesion-promoting layer (26) made of boron-containing nitrides of transition metals includes the substeps: depositing nitrides of one or multiple transition metals from group IV, group V, and group VI of the periodic table at a temperature between 950° C. and 1100° C. to form a plurality of small plates (31) that are oriented at an angle relative to the top side (23), and depositing a boride and/or boron nitride of the one or multiple transition metals. Growing diamond layer (24) on adhesion-promoting layer (26) includes the substeps: seeding adhesion-promoting layer (26) with diamond dust, and growing stalk-shaped diamonds from the gaseous phase on adhesion-promoting layer (26).

The boron-containing, small plate-shaped adhesion-promoting layer promotes the stable chemical growth of the stalk-shaped crystals on the small plate surface, among other ways, by in situ formation of free carbon bonds during the exchange of boron with carbon from the gaseous phase.

Prior to the application of the intermediate layers, the top side of the base body may be roughened until a high degree of roughness results. An average peak-to-valley height Rz, defined for a measuring section having a length of 800 µm, is at least 5 µm, preferably at most 12 µm.

BRIEF DESCRIPTION OF THE DRAWINGS

The following description explains the present invention with reference to exemplary specific embodiments and figures.

Unless stated otherwise, identical or functionally equivalent elements are indicated by the same reference numerals in the figures.

DETAILED DESCRIPTION OF THE INVENTION

Figure 1:
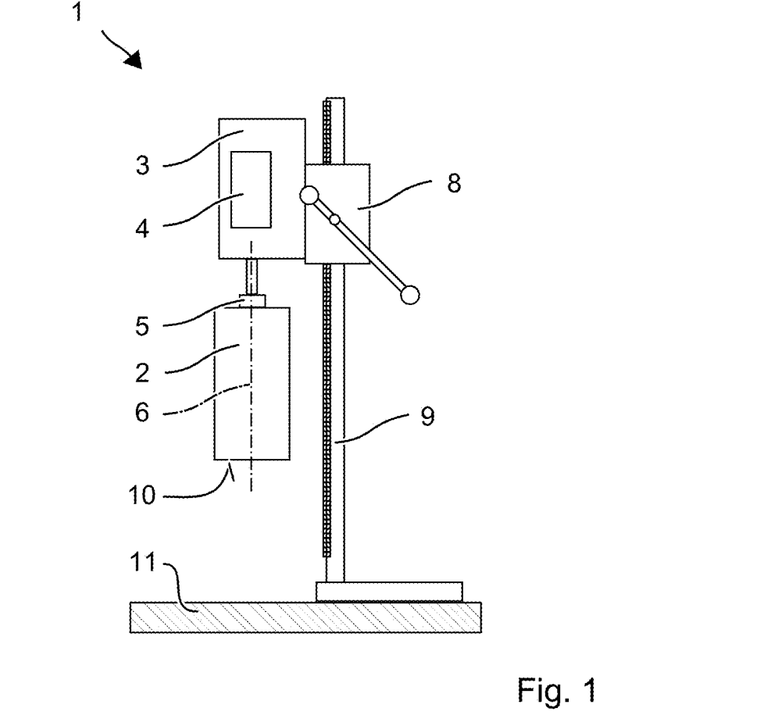
FIG. 1 shows a stand-operated core drilling machine.

FIG. 1 shows by way of example a stand-operated core drilling machine 1 that includes a core drill bit 2. Core drilling machine 1 includes a drive unit 3 with a motor 4. In addition to motor 4, drive unit 3 may include a gear and a safety clutch, among other things. The user may switch motor 4 on and off with an operating switch. Drive unit 3 rotates a tool holder 5 about a working axis 6. Core drill bit 2, oriented coaxially with respect to working axis 6, may be suspended in tool holder 5 and locked. Tool holder 5 transmits the torque of drive unit 3 to core drill bit 2, which thus rotates about working axis 6 in a circumferential direction 7. Drive unit 3 is suspended on a carriage 8 that is movable along a stand 9 in parallel to working axis 6. For example, with the aid of a crank the user may move carriage 8, or alternatively a motor with suitable control may move carriage 8. Cutting end face 10 of core drill bit 2 is pressed with a constant contact pressure against a substrate 11 to be machined. Core drill bit 2 includes multiple cutting plates 12 which are inserted into end face 10 and which cut a circular slot into substrate 11. Cutting plates 12 are designed for machining mineral construction materials, in particular steel-reinforced concrete.

Figure 2:
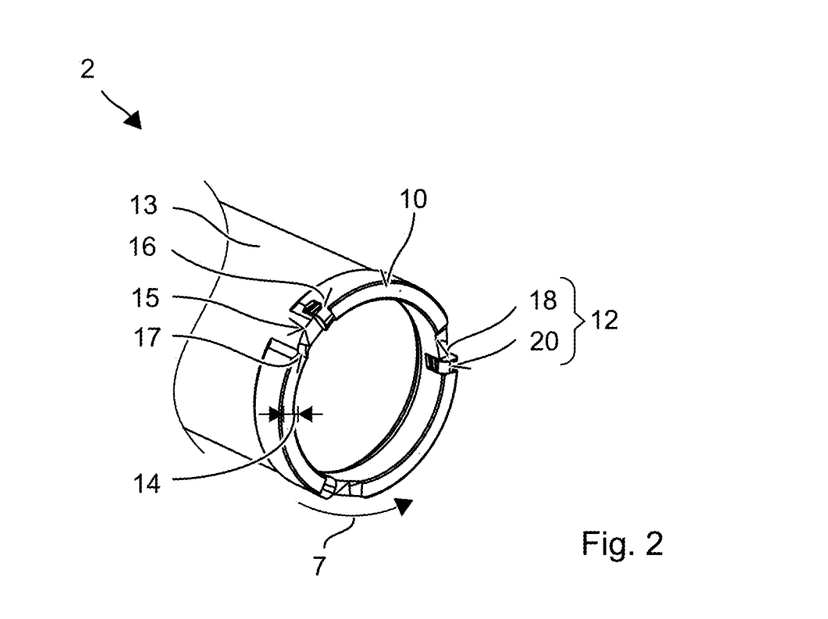
FIG. 2 shows a partial view of a core drill bit.

FIG. 2 shows an example of an end face 10 of core drill bit 2. Core drill bit 2 includes a cylindrical tube 13 that ends in ring-shaped end face 10. The diameters of tube 13 and of end face 10 vary, depending on the field of application. Typical diameters are in the range of 5 cm to 1 m. Wall thickness 14 of tube 13 is typically between 4 mm and 8 mm.

End face 10 is interrupted by multiple recesses 15 situated in circumferential direction 7. Recesses 15 include a steep flank 16 that falls away from end face 10 and a flat flank 17 that rises toward end face 10, which follow one another in circumferential direction 7. Steep flank 16 is, for example, in parallel to or inclined by less than 10 degrees relative to working axis 6. Flat flank 17 extends with an average inclination of less than 45 degrees, for example greater than 30 degrees, and preferably at least 10 degrees from steep flank 16 up to end face 10.

Cutting plate 12 is inserted into recess 15. Cutting face 18 of cutting plate 12 points in circumferential direction 7; cutting face 18 is preferably oriented perpendicularly with respect to circumferential direction 7. Cutting plate 12 has a largely prismatic design; i.e., a rear side 19 of cutting plate 12 has the same or slightly smaller surface area than cutting face 18. Circumferential surface 20 of cutting plate 12 is perpendicular or approximately perpendicular to cutting face 18. Circumferential surface 20 of cutting plate 12 in the example is inclined by at least 75 degrees, preferably at least 80 degrees, for example at most 85 degrees, with respect to cutting face 18.

Rear side 19 of cutting plate 12 rests flatly against steep flank 16 of recess 15. Cutting plate 12 preferably rests with at least 75% of its rear side against tube 13 in order to support cutting plate 12 under the effect of impacts during the machining of construction materials, in particular during sudden engagement with reinforcing bars. Rear side 19 may be soldered or welded to tube 13. Cutting face 18, pointing in circumferential direction 7, is essentially exposed. Flat flank 16 and cutting face 18 delimit a volume that is recessed with respect to end face 10. Cutting plate 12 protrudes beyond end face 10 along working axis 6. The axial overhang is in the range of 0.1 mm to 1 mm. A width 21 of cutting plate 12 may be greater than wall thickness 14 of tube 13, as the result of which cutting plate 12 protrudes in the radial direction, preferably inwardly toward working axis 6 and outwardly away from working axis 6. The radial overhang is preferably in the range between 0.1 mm and 0.5 mm.

Figure 3:
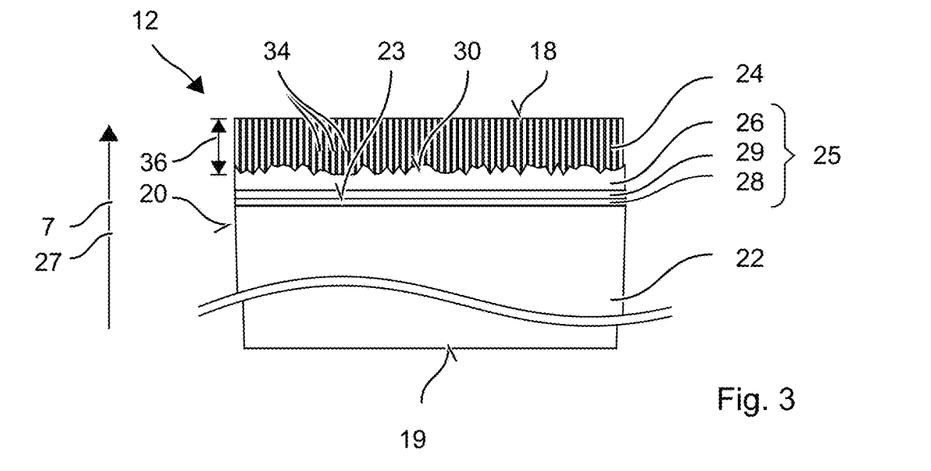
FIG. 3 shows a schematic cross section of a cutting plate of the core drill bit.
Figure 4:
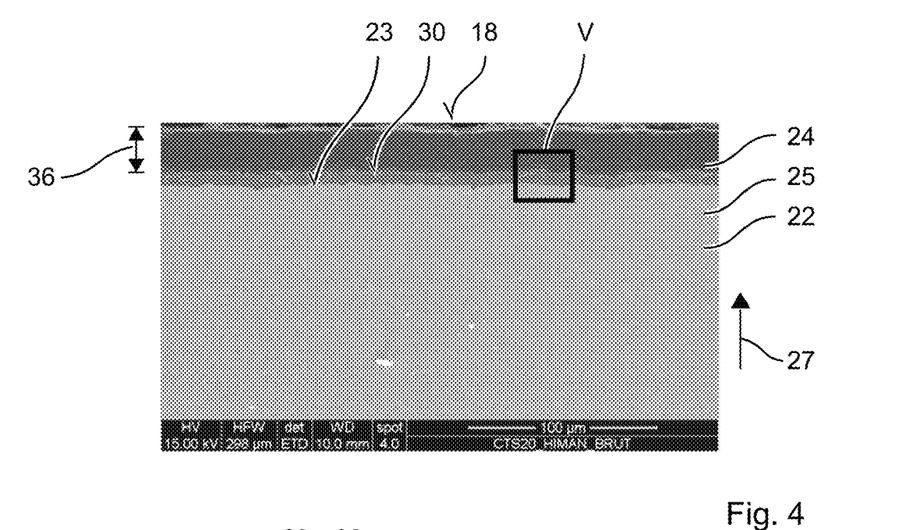
FIG. 4 shows a cross-sectional micrograph of a cutting plate.
Figure 5:
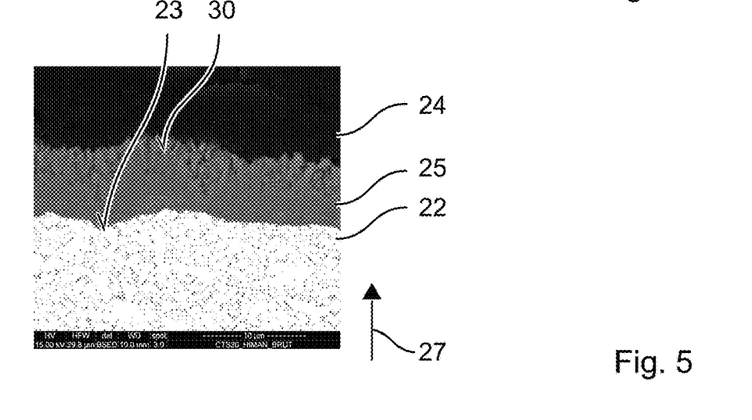
FIG. 5 shows detail V from FIG. 4.

Cutting plate 12 includes a base body 22, and on a top side 23 of base body 22 includes a diamond layer 24 that forms cutting face 18 (FIG. 3). One or multiple intermediate layers 25, for example three intermediate layers 25, are situated between base body 22 and diamond layer 24. Intermediate layers 25 allow deposition of diamond layer 24 in the process as well as a robust, in particular impact-resistant, connection of diamond layer 24 to base body 22. This applies in particular to the intermediate layer, referred to below as adhesion-promoting layer 26, adjoining diamond layer 24. Intermediate layers 25, including adhesion-promoting layer 26, and diamond layer 24 are deposited in succession on base body 22 in a growth direction 27. Cutting plate 12 is preferably inserted into the tool in such a way that the working direction of the cutting plate, in the present case circumferential direction 7, is in parallel to growth direction 27.

Base body 22 in the example forms the majority of cutting plate 12, and determines the shape and dimensions of cutting plate 12, in particular of rear side 19 and of circumferential surface 20. Base body 22 gives cutting plate 12 the necessary mechanical stability, and in particular base body 22 protects diamond layer 24 from bending forces and shear forces during the machining of mineral construction materials. In addition, base body 22 is hard enough to prevent deflection of diamond layer 24 during the machining of mineral construction materials.

Base body 22 is made largely of a sintered hard metal. A preferred hard metal contains grains of tungsten carbide which are embedded in a metallic matrix made of a cobalt-based or nickel-based alloy. The volume proportion of the grains is greater than 80 percent by weight (wt %), preferably greater than or equal to 90 wt %, and less than 95 wt %. The grains are in the ultrafine or submicron range; the average grain size is approximately between 0.2 µm and 1.0 µm. The metallic matrix is made of cobalt or a cobalt-based alloy, for example. The grains of the hard metal, in addition to or instead of tungsten carbide, may be made of other carbides and/or carbonitrides of transition metals of group IV, group V, and group VI of the periodic table. In particular grains of titanium nitride, titanium carbonitride, tantalum carbide, which are characterized by their high hardness level, may be added to the tungsten carbide.

The volume proportion of the metallic matrix is not reduced near top side 23. In particular, the cobalt-containing alloy is not dissolved out by etching methods, which would cause top side 23 to become porous. The hard metal is compressed, in a manner of speaking, on top side 23, as is the case within base body 22. The volume proportion of the metallic matrix is preferably constant in growth direction 27.

Top side 23 of base body 22 is roughened. The roughness may be expressed by arithmetic mean roughness value Ra and average peak-to-valley height Rz. The roughness of base body 22 is determined over a measuring section whose length is set at 800 µm. For arithmetic mean roughness value Ra, the arithmetic mean of the absolute value of the deviation of the point of top side 23 within the measuring section from an average height on the measuring section is ascertained. Arithmetic mean roughness value Ra of top side 23 is greater than 0.7 µm, preferably greater than 1.0 µm, and less than 2.3 µm, preferably less than 1.9 µm. Average peak-to-valley height Rz is the arithmetic mean of the difference between the height of the largest profile peaks and the depth of the largest profile valley within five of the measuring sections. Top side 23 is preferably very jagged, which results in a much greater average peak-to-valley height Rz compared to arithmetic mean roughness value Ra. Average peak-to-valley height Rz is in the range between 5 µm and 13 µm, preferably greater than 6 µm, preferably less than 9 µm. The roughness may be adjusted using a suitable particle blasting process, i.e., compressed air blasting using a granular abrasive material, on top side 23.

A thin barrier layer 28 may be grown directly on the hard metal on top side 23 of base body 22. Barrier layer 28 has a thickness between 0.1 µm and 2.0 µm, and completely covers top side 23. Barrier layer 28 is intended to represent a diffusion barrier for carbon in order to prevent carbon from escaping from the hard metal. Barrier layer 28 should adhere well to the hard metal, and should preferably result in little reduction in the overall hardness of the component. Titanium nitride, which already forms a sufficient diffusion barrier at a low layer thickness of 0.3 µm, has proven to be particularly suitable for this purpose. In addition, titanium nitride adheres well to tungsten carbide-based hard metals.

A carbon-containing promotion layer 29 may grow on barrier layer 28 from the gaseous phase. Promotion layer 29 has a thickness between 0.5 µm and 3 µm, for example. Preferred promotion layer 29 is made of a carbide and/or carbonitride of the transition metal of barrier layer 28, for example titanium carbide or titanium carbonitride. The carbides and/or carbonitrides of transition metals of group IV, group V, and group VI may be deposited instead of or in addition to the transition metal of barrier layer 28.

Intermediate layers 25 contain an adhesion-promoting layer 26 that allows growth of the diamonds in the desired manner. Adhesion-promoting layer 26 has a high degree of microroughness on its contact side 30 facing diamond layer 24. The roughness results from a structure of thin small plates 31 oriented essentially vertically with respect to top side 23. Small plates 31 are made up largely of one or multiple nitrides of the transition metals of group IV, group V, and group VI. The transition metal is preferably titanium, in particular when preceding intermediate layers 25 are titanium-based. Small plates 31 preferably contain no carbon and no carbide. The molar ratio of carbon to nitrogen in small plates 31 may be much less than 1 to 20, and may be attributed to impurities in the reaction chamber or diffusion processes from the diamond deposition. The narrow sides or edges 32 of small plates 31 which point toward diamond layer 24 preferably contain boron. The boron may be present as the boride of the transition metal, the boron nitride of the transition metal, and/or atomic boron at lattice defects. Preferably only a thin boundary layer of small plates 31, for example less than 100 nm thick, contains boron. Adhesion-promoting layer 26 chemically and mechanically binds diamond layer 24 to the sintered hard metal of base body 22.

Figure 6:
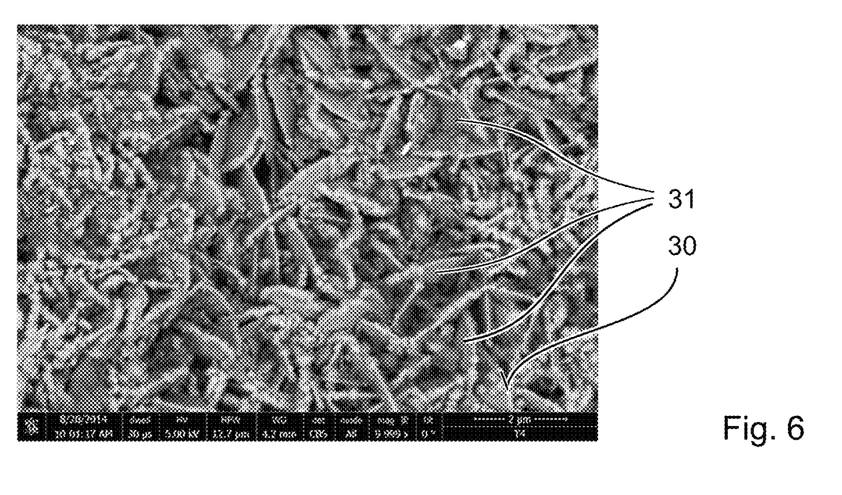
FIG. 6 shows a top view onto a small plate structure of the adhesion-promoting layer.
Figure 7:
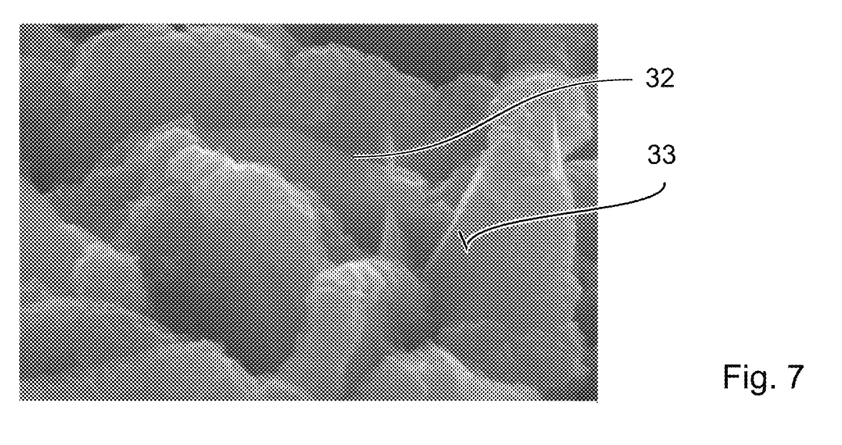
FIG. 7 shows an enlarged detail from FIG. 6.

Small plates 31 form a lenticular structure with very steep slopes. Small plates 31 in each case include two oppositely situated, largely identical side faces 33 that are parallel or slightly inclined toward one another. The side faces are oriented vertically or at an angle with respect to average top side 23 of base body 22. The inclination of side faces 33 is greater than 60 degrees, preferably greater than 80 degrees. A thickness of the small plate is specified by the distance from the side faces. The thickness is significantly less than the length and height of side faces 33 or of small plate 31, and the height is preferably at least two times, for example ten times, greater than the width. The length of small plates 31 may be greater than or equal to the height. Small plates 31 on average have a length between 1 μm and 5 μm, a height between 0.5 μm and 2 μm, and a width much less than 0.7 μm. FIG. 6 shows a top view onto small plates 31; the granular structure on edges 32 represents boron compounds. FIG. 7 is an enlarged illustration of FIG. 6. Small plates 31 have narrow exposed edges 32 that point in growth direction 27, i.e., toward diamond layer 24. Small plates 31 cover essentially entire contact side 30, preferably at least 75% of its surface. Edges 32 of small plates 31 form an elevated reticular structure. Small plates 31 are oriented, without discernible regularity, in different directions in the plane of adhesion-promoting layer 26. Small plates 31 may adjoin one another at various angles, which may be in the range between 20 degrees and 90 degrees, for example.

Diamond layer 24 is deposited on adhesion-promoting layer 26, in particular small plates 31. Boron-containing edges 32 of small plates 31 promote the chemical bond of diamond to adhesion-promoting layer 26. Freely oriented small plates 31 increase the adhesion between diamond layer 24 and base body 22.

More than 90% of diamond layer 24 is made up of numerous individual rod-shaped crystals, referred to below as stalks 34, which form due to growth of the nanodiamond seeds. The first nanodiamond seed layer is fixedly chemically and mechanically anchored to adhesion-promoting layer 26. Stalks 34 are oriented vertically with respect to contact side 30 of adhesion-promoting layer 26, i.e., top side 23. Stalks 34 adjoin one another. Neighboring stalks are separated by grain boundary surfaces 35 that are formed between the stalks. Stalks 34 generally extend from nanodiamond seed layer 26 to cutting face 18; i.e., a height of stalks 34 is equal to height 36 of diamond layer 24. Diamond layer 24 has proven to be extremely durable with regard to impacts. Diamond layer 24 made of the stalks has been found to be mechanically stable and robust against static and dynamic loads from different directions and impacts.

Despite the stalk shape, diamond layer 24 has a very high hardness level, which is necessary for machining hard mineral materials.

Figure 8:
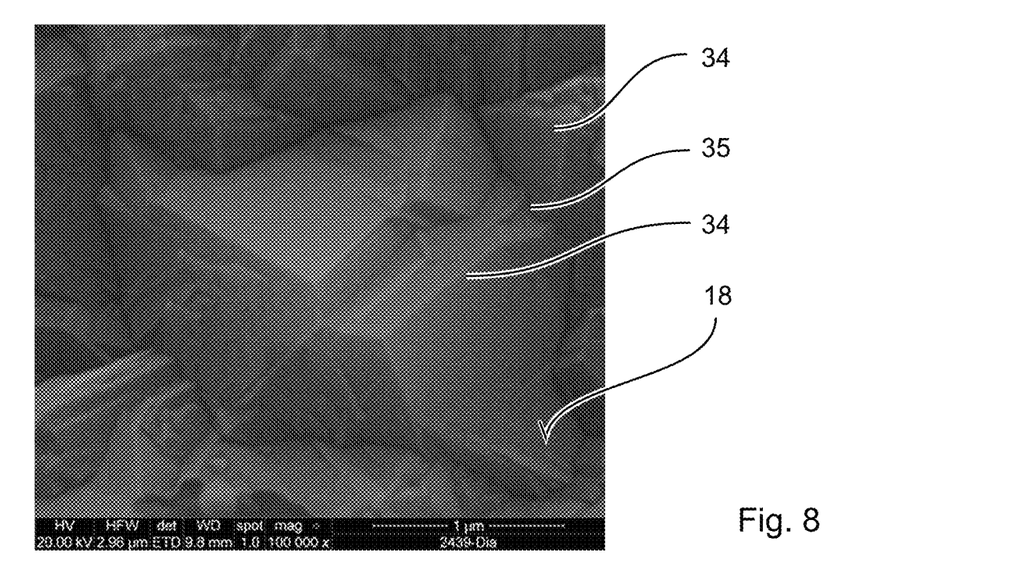
FIG. 8 shows a top view onto the thin-stalked diamond layer.
Figure 9:
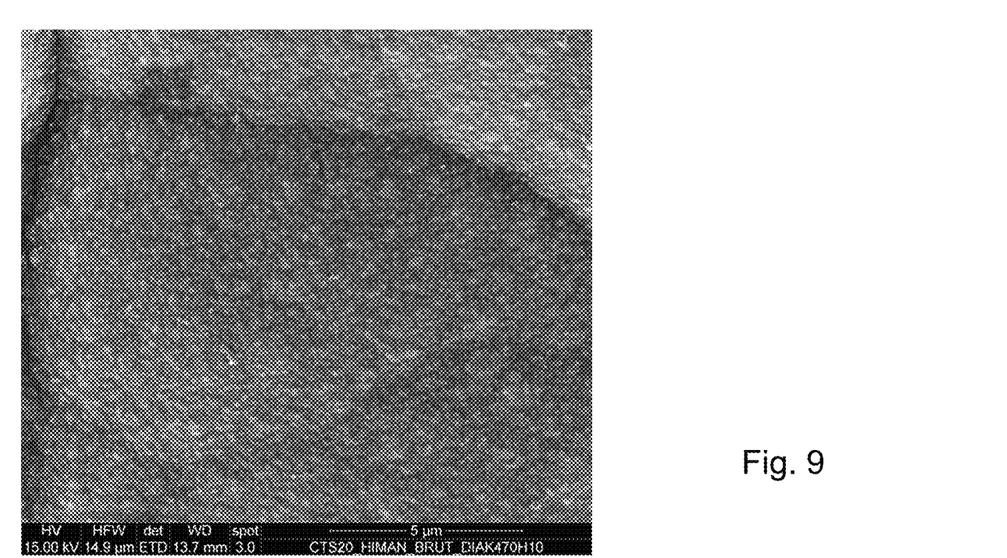
FIG. 9 shows a top view onto the thick-stalked diamond layer.

Stalks 34 are preferably very thin. The aspect ratio of the stalks, i.e., the ratio of the height to the diameter, is greater than three, preferably greater than five. The thin stalks have proven to be more robust against impact stresses. The diameter is determined in a plane in parallel to top side 23, and the height is determined perpendicularly with respect to top side 23. Thin stalks 34 preferably have a height of greater than 10 μm, for example greater than 20 μm, preferably greater than 40 μm. A height of up to 100 μm may be achieved. Stalks 34 extend over the entire height 36 of diamond layer 24. The diameter of stalks is less than 10 μm, although a much smaller diameter of less than 2 μm (FIG. 9), less than 100 nm, and at least 10 nm (FIG. 8) is preferred. The stability of the stalks results from the support on neighboring stalks, and the chemical bond.

Stalks 34 of diamond layer 24 are homogeneous over the entire diamond layer 24 with respect to their dimensions and the crystal orientation along growth direction 27. For example, the diameter of approximately 80% of stalks 34 differs from the average diameter of stalks 34 by less than 50%. Stalks 34 have a cubic crystal lattice that corresponds to the diamond. A crystal axis of stalks 34 is oriented along height 36 of stalks 34. This vertical crystal axis may be the [110] crystal axis or the [111] crystal axis, for example. Stalks 34 of diamond layer 24 all have essentially the same vertical crystal axis. The crystal orientations of stalks 34 are thus in parallel to one another along growth direction 27 or height of stalks 34.

The production of a diamond layer 24 on a sintered hard metal is explained by way of example with reference to the manufacture of a cutting plate 12.

Base body 22 is formed from a green compact. The green compact contains a mixture of grains and a metallic binder. The proportion of grains in the mixture is at least 60 vol %, preferably at least 90 vol %, at most 94 vol %. The grains have a size approximately between 0.5 μm and 5.0 μm. The grains in this example are made of tungsten carbide, for example. The tungsten carbide may be partially or completely replaced by other carbides, nitrides, and/or carbonitrides of transition metals. In particular grains of titanium nitride, titanium carbonitride, tantalum carbide, which are characterized by their high hardness level, may be added to the tungsten carbide. The metallic binder is preferably cobalt, nickel, or an alloy of cobalt and nickel. The green compact is pressed and brought into a shape that corresponds to base body 22. The shape takes into account the shrinkage process during sintering. The green compact is subsequently sintered between 1100 degrees Celsius (° C.) and 1350° C.

Sintered base body 22 may be mechanically finished. Top side 23 of base body 22 is cleaned to prepare it for the deposition of adhesion-promoting layer 26. Top side 23 may in particular be sandblasted, for example with silicon carbide. The grains of the silicon carbide may have an average size of 180 μm, for example. Top side 23 is thus not only cleaned of oxide layers and other impurities, but also preferably acquires a desired roughness.

Example 1: Direct Deposition of
Adhesion-Promoting Layer 26 on Base Body 22
with Subsequent Growth of a Diamond Layer 24
with Relatively Wide Rod-Shaped Diamond
Crystals Adhesion-promoting layer 26 is deposited on base body 22 from the gaseous phase (CVD process). The method in the example deposits small plates 31 of adhesion-promoting layer 26, made of nitrides of a transition metal, directly on the hard metal of base body 22. The deposition is divided into two phases. Preferably pure nitride small plates 31 are deposited in a first phase. Boron-containing nitride is deposited in a second phase. The deposition is described by way of example for small plates 31 made of titanium nitride.

For the first phase, the atmosphere in a reactor is composed of titanium(IV) chloride (TiCl4), nitrogen (N2), and hydrogen (H2). The atmosphere is in particular free of carbon-containing gases. The volume proportion of titanium (IV) chloride is between 1 vol % and 5 vol %, preferably between 2 vol % and 3 vol %. The volume proportion of hydrogen is between 50 vol % and 70 vol %, for example, and the volume proportion of nitrogen is between 30 vol % and 45 vol %, for example. Nitrogen is provided in the gaseous phase in great excess with respect to the titanium (IV) chloride. In one example, the relative proportions are: 160 volume units of hydrogen, 105 volume units of nitrogen, and 7 volume units of titanium(IV) chloride. The temperature in the reaction chamber is set to be quite high compared to other deposition processes. Temperatures of greater than 950 degrees Celsius (° C.) have proven to be advantageous, or even necessary, for the growth of the small plate structure. The temperature may be held constant during the deposition. Temperatures above 1100° C. have proven to be disadvantageous, since the base body changes. A temperature of 1000° C. is set for the above example. The pressure in the reaction chamber is in the range between 550 mbar and 650 mbar, for example. The pressure is set to 600 mbar for the above example. Small plates 31 having an average height between 3 µm and 4 µm may be produced with the parameters in the example. The width of small plates 31 is less than 0.2 µm. The growth rate is in the range of 1 µm to 5 µm per hour. The first phase is terminated after 50 min, for example.

The composition of the atmosphere is changed slightly in the reactor for the second phase by introducing boron trichloride (BCl3) in addition to titanium(IV) chloride (TiCl4), nitrogen (N2), and hydrogen (H2). The proportion of boron trichloride is between 0.1% and 0.4%; the gas proportions of TiCl4, N2, and H2 remain unchanged from the first phase. The other process parameters, such as pressure and temperature, of the first phase are likewise maintained. Small plates 31 of titanium nitride continue to grow. Crystals of titanium diboride titanium boride compounds deposit on edges 32 of small plates 31, whereas essentially none deposit on side faces 33 of small plates 31. Side faces 33 thus retain a composition of pure titanium nitride. The deposition is ended after 10 minutes. The layer thickness of the titanium boride compounds is in the range between 10 nm and 200 nm.

Base body 22 which is coated with adhesion-promoting layer 26 is coated with diamond layer 24 in a further gas phase deposition (CVD process). Prior to the coating, seeds for the stalk-shaped crystals are applied to adhesion-promoting layer 26. Diamond dust is suitable as seed. The diamond dust contains diamond crystals having a diameter between 4 nm and 50 nm. The seeds may be sprayed on in a suspension, for example.

In a second reactor, diamond layer 24 is deposited from the gaseous phase on base body 22, provided with crystallization seeds. The atmosphere in the reactor is composed of methane and hydrogen. The methane content is between 0.8 vol % and 1.6 vol %, preferably greater than 1.0 vol %, preferably less than 1.4 vol %, and in one example is 1.2 vol %. The pressure in the reaction chamber is low, preferably between 2 mbar and 20 mbar, and in the example is 5 mbar.

The deposition takes place at a temperature between 700° C. and 850° C., for example 770° C. The diamond crystals grow from the crystallization seeds. The titanium diboride is sacrificed for the growth, in that the titanium-boron bond is broken and the boron is at least partially released, and free surface bonds ("dangling bonds") are formed. The crystal growth is favored at the top edge of the small plates, as the result of which the diamond crystals grow more quickly there. The growth thus begins primarily on edges 32 of small plates 31. The diamond crystals grow in height and width until their extension is hindered by another diamond crystal. The diamond crystals subsequently grow essentially only in height, resulting in the stalk-shaped crystal. Under the growth conditions, in particular the concentration of methane, the average diameter is between 1 µm and 10 µm, for example 4 µm. The deposition rate is between 0.1 µm and 0.5 µm per hour. It has been possible to achieve a layer thickness of 43 µm in a period of 160 hours.

Example 2: Direct Deposition of Adhesion-Promoting Layer 26 on Base Body 22 with Subsequent Growth of a Diamond Layer 24 with Relatively Wide Rod-Shaped Diamond Crystals The second example differs from the first example in that the small plate-shaped titanium nitride is deposited in three phases. Base body 22 is prepared similarly as in Example 1.

A first layer of titanium nitride is deposited on the hard metal from the gaseous phase (CVD process). For the first phase, the atmosphere in a reactor is composed of titanium (IV) chloride (TiCl4), nitrogen (N2), and hydrogen (H2). The atmosphere is in particular free of carbon-containing gases. The volume proportion of titanium(IV) chloride is between 1 vol % and 4 vol %, for example 1.2 vol %. The volume proportion of hydrogen is between 50 vol % and 70 vol %, for example, and the volume proportion of nitrogen is between 30 vol % and 45 vol %, for example. Nitrogen is provided in the gaseous phase in a very great excess with respect to the titanium(IV) chloride. In one example, relative proportions are: 170 volume units of hydrogen, 100 volume units of nitrogen, and 3 volume units of titanium(IV) chloride. The temperature in the reaction chamber is between 750 degrees Celsius (° C.) and 850° C., for example 800° C. The pressure in the reaction chamber is in the range between 550 mbar and 650 mbar, for example. The pressure is set to 600 mbar in the above example. The growth with the small proportion of titanium-containing gas is carried out for approximately 60 minutes to 90 minutes in order to obtain a layer approximately 0.1 µm to 0.5 µm thick. Due to the low growth, the layer is largely homogeneous without a small plate structure.

The proportion of titanium(IV) chloride is increased to a volume proportion between 1.5 vol % and 7 vol %, preferably a proportion between 2 vol % and 3 vol %. The volume proportion of hydrogen is between 50 vol % and 70 vol %, for example, and the volume proportion of nitrogen is between 30 vol % and 45 vol %, for example. The relative proportions are 160 volume units of hydrogen, 105 volume units of nitrogen, and 7 volume units of titanium(IV) chloride, for example. The temperature in the reaction chamber and the pressure are maintained. Small plates 31 having an average height between 3 µm and 4 µm may be produced with the parameters in the example. The width of small plates 31 is less than 0.2 µm. The growth rate is in the range of 5 µm per hour. The first phase is terminated after 50 min, for example.

For the boronation of edges 32, the composition of the atmosphere is changed by introducing boron trichloride (BCl3) in addition to titanium(IV) chloride (TiCl4), nitrogen (N2), and hydrogen (H2). The proportion of boron trichloride is between 0.1 vol % and 0.4 vol %, for example 0.2 vol %, whereas the gas proportions of TiCl4, N2, and H2 remain unchanged from the preceding phase. The other process parameters such as pressure and temperature are likewise maintained. Small plates 31 of titanium nitride continue to grow. Crystals of titanium diboride compounds deposit on edges 32 of small plates 31, whereas essentially none deposit on side faces 33 of small plates 31. Side faces 33 thus retain a composition of pure titanium nitride. The deposition is ended after 10 minutes. The layer thickness of the titanium boride compounds is in the range between 10 nm and 200 nm.

The growth of diamond layer 24 may take place as in Example 1; for the description, reference is therefore made to the above example.

Example 3: Deposition of a Four-Part Intermediate Layer on Base Body 22 with Subsequent Growth of a Diamond Layer 24 with Very Thin Rod-Shaped Diamond Crystals Adhesion-promoting layer 26 made of small plates 31 is not applied directly to the hard metal of base body 22, but, rather, is applied to a sequence of two intermediate layers 25. A barrier layer 28 is initially applied to base body 22, and a carbon-rich layer is applied to barrier layer 28, before carbon-free adhesion-promoting layer 26 is applied. Intermediate layers 25 in the example contain titanium as the basis for the nitrides and carbides; in particular for carbon-containing promotion layer 29, the layer may also contain tantalum, vanadium, or chromium in addition to titanium. The deposition (CVD process) of the three intermediate layers 25 preferably takes place in a reactor. Top side 23 of base body 22 may be cleaned before beginning the deposition, as in the first example.

Barrier layer 28 is deposited from a gaseous phase containing titanium(IV) chloride (TiCl4), nitrogen (N2), and hydrogen (H2). The proportion of titanium(IV) chloride is 1 vol % to 4 vol %, and nitrogen and hydrogen are present in approximately identical proportions. The deposition preferably takes place at a comparatively low temperature in the range of 750° C. to 850° C., for example 800° C. The pressure in the reaction chamber is between 550 mbar and 650 mbar, for example 600 mbar. Barrier layer 28 grows continuously as a smooth layer. The deposition is continued until a barrier layer 28 between 0.1 μm and 0.5 μm thick is achieved. Under the stated growth conditions, this takes between 60 and 90 minutes.

The composition of the gaseous phase is changed for promotion layer 29. The gaseous phase now contains titanium(IV) chloride, methane (CH4), and hydrogen (H2). The proportion of methane is between 5 vol % and 10 vol %, for example 7.5 vol %. The proportion of titanium(IV) chloride is between 2 vol % and 8 vol %, for example 4.5 vol %. The ratio of methane to titanium(IV) chloride is approximately 10 to 6. Hydrogen is provided in great excess. The pressure in the reaction chamber is lowered to a range between 70 mbar and 90 mbar, for example 80 mbar. The temperature is preferably increased to 950° C. to 1050° C., for example 1000° C. The deposition is continued until a promotion layer 29 between 1 μm and 2 μm thick is deposited. Under the stated growth parameters, this takes approximately 10 min to 20 min.

Adhesion-promoting layer 26 is initially started with a low-pressure deposition on promotion layer 29. The gaseous phase contains titanium(IV) chloride (TiCl4), nitrogen (N2), and hydrogen (H2). The atmosphere is in particular free of carbon-containing gases. The volume proportion of titanium (IV) chloride is between 0.5 vol % and 4 vol %, preferably between 1.0 vol % and 1.5 vol %. The volume proportion of hydrogen is between 50 vol % and 90 vol %, for example, and the volume proportion of nitrogen is between 15 vol % and 40 vol %, for example. Nitrogen is provided in the gaseous phase in great excess with respect to the titanium (IV) chloride. In one example, the relative proportions are: 240 volume units of hydrogen, 50 volume units of nitrogen, and 4 volume units of titanium(IV) chloride. The pressure in the reaction chamber is 550 mbar to 650 mbar, for example 600 mbar. The temperature is held at a high level between 950° C. and 1050° C., for example 1000° C. The deposition takes place for approximately 60 minutes to 120 minutes in order to obtain a titanium nitride layer between 2 μm and 3 μm thick. Small plates 31 have a height of 1 μm to 2 μm.

The boronation of small plates 31 takes place with a changed composition of the atmosphere, by introducing boron trichloride (BCl3) in addition to titanium(IV) chloride (TiCl4), nitrogen (N2), and hydrogen (H2). The proportion of boron chloride trichloride is between 0.1% and 0.4%, and the gas proportions of TiCl4, N2, and H2 remain unchanged from the preceding deposition of small plates 31. Likewise, the temperature remains at the elevated level. The pressure is increased to 550 mbar to 650 mbar, for example 600 mbar. Small plates 31 of titanium nitride continue to grow. Crystals of titanium-boron compounds deposit at edges 32 of small plates 31, whereas essentially none deposit on side faces 33 of small plates 31. Side faces 33 thus retain a composition of pure titanium nitride. The deposition is ended after 10 minutes. The layer thickness of the titanium boride compounds is in the range between 10 nm and 200 nm.

Diamond layer 24 is deposited on boronated small plates 31. The deposition of diamond layer 24 may take place as in the first example. A changed method allows more rapid growth of diamond layer 24 with similar good properties, in particular a diamond layer 24 having virtually the same height.

Adhesion-promoting layer 26 is seeded with nanodiamond powder. The growth of the rod-shaped diamond crystals takes place from the gaseous phase (CVD process). The atmosphere contains methane (CH4) and hydrogen (H2). The methane content, at 2.5 vol % to 4.0 vol %, for example 2.9 vol %, is higher than for the deposition according to the first method. The pressure is between 2 mbar and 20 mbar, preferably between 5 mbar and 8 mbar. The deposition temperature is in the range between 700° C. and 850° C., for example 750° C. The high methane content in the gaseous phase results in increased secondary seed formation during the diamond growth, which reduces the grain diameter, transverse to the growth direction, down to the nanometer range. Nevertheless, some stalk-shaped growth is still present. However, this results in more grain boundaries, and consequently, significantly thinner stalks 34. Diamond layer 24 with thin stalks 34 is somewhat weaker than that from the first example, although it has still been possible to achieve stable diamond layers up to a height 36 of 23 μm. Diamond layer 24 with thin stalks 34 may also be deposited on adhesion-promoting layer 26 of Example 1 or 2.

What is claimed is:

1. A manufacturing method for a cutting plate, the method comprising the steps of:

shaping and sintering a base body of the cutting plate made of a hard metal;

depositing at least one intermediate layer, including an adhesion-promoting layer made of boron-containing nitrides of transition metals, on a top side of the base body with the aid of a gas deposition process, the deposition of the adhesion-promoting layer including the steps of:

depositing at least one nitride of at least one transition metal selected from group IV, group V, and group VI of the periodic table at a temperature between 950° C. and 1100° C. to form a plurality of small plates oriented at an angle relative to the top side, and being made of the at least one nitride of the at least one transition metal; and depositing a boride or boron nitride of the at least one transition metal;

growing a diamond layer on the adhesion-promoting layer, the growing including the steps of:

seeding the adhesion-promoting layer with diamond dust; and growing stalk-shaped diamonds from a gaseous phase on the adhesion-promoting layer.

2. The manufacturing method as recited in claim 1 wherein the top side is machined with a solid blasting abrasive, using a compressed air method, until an average peak-to-valley height is at least 5 μm for a measuring section having a length of 800 μm.

3. The manufacturing method as recited in claim 1 wherein the cutting plate is a core drill bit cutting plate.

4. A cutting plate comprising:

a base body made of a sintered hard metal;

at least one intermediate layer on a top side of the base body, the intermediate layer including an adhesion-promoting layer made of a boron-containing nitride of a transition metal selected from group IV, group V, and group VI, and contains a plurality of small plates oriented at an angle relative to the top side; and a diamond layer grown on the adhesion-promoting layer, the diamond layer being made of stalk-shaped crystals, oriented vertically relative to the top side, and having an aspect ratio greater than five.

5. The cutting plate as recited in claim 4 wherein the top side of the base body has an average peak-to-valley height of at least 5 μm for a measuring section having a length of 800 μm.

6. The cutting plate as recited in claim 4 wherein crystal axes of the stalk-shaped crystals are vertical with respect to the top side and identical.

7. The cutting plate as recited in claim 4 wherein a height of the diamond layer is equal to the height of the stalk-shaped crystals.

8. The cutting plate as recited in claim 4 wherein the stalk-shaped crystals have a homogeneous diameter.

9. The cutting plate as recited in claim 4 wherein neighboring ones of the stalk-shaped crystals adjoin one another via a grain boundary.

* * * * *